United States Patent

Schumacher et al.

(10) Patent No.: US 9,058,135 B1
(45) Date of Patent: Jun. 16, 2015

(54) SYNCHRONIZATION OF TIMERS ACROSS CLOCK DOMAINS IN A DIGITAL SYSTEM

(71) Applicant: Xilinx, Inc., San Jose, CA (US)

(72) Inventors: Paul R. Schumacher, Berthoud, CO (US); Graham F. Schelle, Longmont, CO (US)

(73) Assignee: XILINX, INC., San Jose, CA (US)

( * ) Notice: Subject to any disclaimer, the term of this patent is extended or adjusted under 35 U.S.C. 154(b) by 311 days.

(21) Appl. No.: 13/674,621

(22) Filed: Nov. 12, 2012

(51) Int. Cl.
*G06F 1/12* (2006.01)
*G11C 7/22* (2006.01)
*G06F 1/14* (2006.01)
*G06F 5/06* (2006.01)
*G06F 1/10* (2006.01)

(52) U.S. Cl.
CPC .. *G06F 1/12* (2013.01); *G11C 7/22* (2013.01); *G06F 1/14* (2013.01); *G06F 5/06* (2013.01); *G06F 1/10* (2013.01)

(58) Field of Classification Search
CPC ............... G06F 1/12; G06F 1/14; G06F 5/06; G11C 7/22
USPC ................................... 713/300, 310, 330, 340
See application file for complete search history.

(56) References Cited

U.S. PATENT DOCUMENTS

| 5,487,092 | A  | * | 1/1996  | Finney et al. ................. 375/354 |
| 7,134,035 | B2 | * | 11/2006 | Sharma et al. ................ 713/500 |
| 2002/0059535 | A1 | * | 5/2002  | Bekritsky et al. ............. 713/400 |
| 2012/0331026 | A1 | * | 12/2012 | Menkhoff ..................... 708/300 |
| 2014/0122755 | A1 | * | 5/2014  | Chandra et al. ............... 710/106 |

OTHER PUBLICATIONS

Gordon, Caleb, Tekron White Paper, "Introduction to IEEE 1588 & Transparent Clocks", pp. 1-19, Jun. 2009, Tekron International.

* cited by examiner

*Primary Examiner* — Thomas Lee
*Assistant Examiner* — Mohammad A Rahman
(74) *Attorney, Agent, or Firm* — Kevin T. Cuenot (57) ABSTRACT

Testing a digital system includes calculating a first ratio of a first clock frequency for a first clock domain and a second clock frequency for a second clock domain different from the first clock domain using a processing device and calculating a first offset between a first timer in the first clock domain and a second timer in the second clock domain. Using an expression dependent upon the first offset and the first ratio, event data from at least one of the first clock domain or the second clock domain is converted to a common clock domain.

20 Claims, 5 Drawing Sheets

SYNCHRONIZATION OF TIMERS ACROSS CLOCK DOMAINS IN A DIGITAL SYSTEM

FIELD OF THE INVENTION

One or more embodiments disclosed within this specification relate to the synchronization of timers across clock domains in a digital system.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that include, for example, function generators, registers, arithmetic logic, and so forth.

The programmable interconnect circuitry and programmable logic circuitry typically are programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Modern digital systems, including some programmable ICs, can include both a processor that is capable of executing program code operating in cooperation with electronic circuitry, e.g., dedicated circuitry. The electronic circuitry typically performs one or more functions, but does not execute program code as does the processor. Still, while both portions of the IC operate cooperatively, each typically functions in an independent clock domain. The processor usually operates in a processor-specific clock domain, while the electronic circuitry, e.g., programmable tiles in the case of a programmable IC, operates in a different clock domain.

In order to test, debug, and/or evaluate the digital system, it becomes necessary to interpret events that occur within each of the various clock domains of the digital system. A frame of reference must be developed in which events that occur within any clock domain can be analyzed. This sort of analysis requires synchronization of clock domains without undue overhead.

SUMMARY

A method of testing a digital system includes calculating a first ratio of a first clock frequency for a first clock domain and a second clock frequency for a second clock domain different from the first clock domain using a processing device and calculating a first offset between a first timer in the first clock domain and a second timer in the second clock domain. The method further includes using an expression dependent upon the first offset and the first ratio to convert event data from at least one of the first clock domain or the second clock domain to a common clock domain.

A method of testing a digital system includes, within a first clock domain of the digital system including a first timer, sending a first timer value and a second timer value from the first timer to a second clock domain of the digital system. The method further includes determining a first timer value from a second timer in the second clock domain responsive to receiving the first timer value from the first timer and determining a second timer value from the second timer responsive to receiving the second timer value from the first timer. The method includes storing a first timer value pair including the first timer value from the first timer and the first timer value from the second timer in a memory using a processing device. A second timer value pair including the second timer value from the first timer and the second timer value from the second timer also can be stored in the memory.

An integrated circuit includes a first portion of a digital system having a first processing device and a first timer configured to operate in a first clock domain. The first processing device is configured to read timer values from the first timer and send the timer values. The integrated circuit further includes a second portion of the digital system having a second processing device and a second timer configured to operate in a second clock domain that is different from the first clock domain. The second processing device is configured to determine a first timer value from the second timer responsive to receiving a first timer value from the first timer and determine a second timer value from the second timer responsive to receiving a second timer value from the first timer. The second processing device is further configured to store a first timer value pair including the first timer value from the first timer and the first timer value from the second timer and store a second timer value pair including the second timer value from the first timer and the second timer value from the second timer.

DETAILED DESCRIPTION OF THE DRAWINGS

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

One or more embodiments disclosed within this specification relate to the synchronization of timers across clock domains in a digital system. Within a digital system, a training process is implemented that allows timers operating in two or more disparate clock domains to be synchronized. The training process facilitates the creation of an expression through which events recorded in two or more clock domains of the digital system can be analyzed as if having occurred in a single, common clock domain. As such, the events from different clock domains occurring in the digital system can be evaluated in terms of absolute time as represented by the common clock domain.

Within this specification, two clock domains are said to be different when each clock domain operates from a different frequency or clock source. In this regard, the clock domains, in reference to the various circuit elements controlled by the clock signal of the clock domain, are also independent of one another. As an example, two clock domains that are different can have entirely different clock frequencies. In another example, two different clock domains can have clock frequencies that are intended to be the same, but since taken from different clock sources may vary slightly. In that case, the clock domains that have same clock frequencies but different sources may have phase differences between the clocks or slight variation in clock frequency due to drift in the clock(s), thermal effects, or other physical properties of the IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
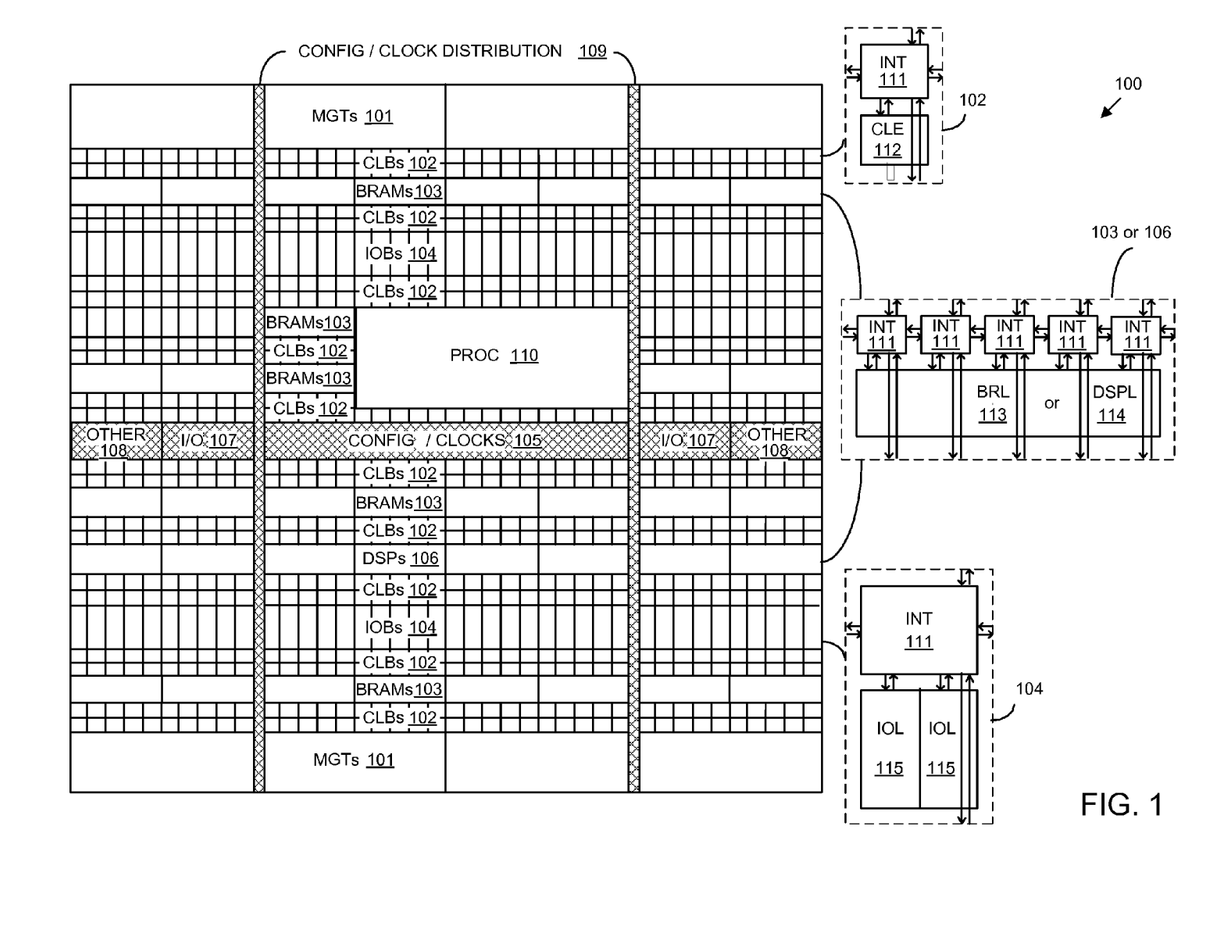
FIG. 1 is a block diagram illustrating an exemplary architecture for a semiconductor integrated circuit (IC).

FIG. 1 is a block diagram illustrating an exemplary architecture 100 for a semiconductor integrated circuit (IC). Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An 10B 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block implementing a processing device and depicted as PROC 110 spans several columns of CLBs and BRAMs.

In one aspect, PROC 110 is implemented as a dedicated circuitry, e.g., as a hard-wired processor or central processing unit, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. The number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation of the features disclosed within this specification.

In one example, architecture 100 is configurable to include two or more different clock domains. PROC 110 operates in a first clock domain, while other portions of architecture 100, e.g., the programmable circuitry, operate in at least a second different clock domain. It should be appreciated that the programmable circuitry of architecture 100 can implement two or more different clock domains. In one aspect, PROC 110 controls the actual clock frequency within one or more different clock domains implemented within the programmable circuitry.

Figure 2:
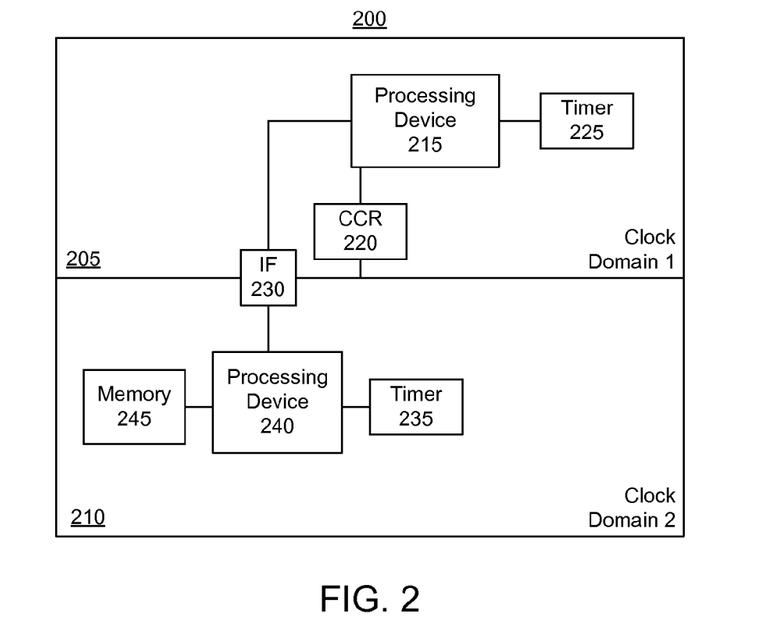
FIG. 2 is a block diagram illustrating another example of a semiconductor IC.

FIG. 2 is a block diagram illustrating an example of a semiconductor IC (IC) 200. IC 200 includes a first portion of a digital system denoted as subsystem 205 operating in a first clock domain shown as clock domain 1. IC 200 further includes a second portion of the digital system denoted as subsystem 210 operating in a second clock domain shown as clock domain 2. In general, each of subsystems 205 and 210 includes a processing device. A "processing device" refers to a processor or a controller. A processor is a device configured to execute program code such as a central processing unit or CPU. A controller refers to circuitry that does not execute program code. A controller, for example, can implement a state machine using circuitry or other logic without executing program code.

For example, subsystem 205 can be implemented as a processor subsystem and subsystem 210 can be implemented as electronic circuitry. In illustration, IC 200 can be implemented having an architecture similar to that described with reference to FIG. 1. In that case, subsystem 205 corresponding to the processor subsystem is configured to execute program code, e.g., as is PROC 110. Subsystem 210 is formed of programmable circuitry. It should be appreciated, however, that subsystem 210 need not be programmable circuitry as described, but rather can be hardwired circuitry or a combination of hardwired and programmable circuitry. In one aspect, the clock frequency of the various clock domains implemented within subsystem 210 is controllable by subsystem 205.

While a processor clock domain (e.g., a software-based clock domain) and a non-processor clock domain are used as examples, it should be appreciated that the clock domains need only be different. In one example, each clock domain can include a processor. In another example, only one clock domain includes a processor. In another example, neither clock domain includes a processor. For example, both clock domains can include only circuitry and appropriate controllers devoid of a processor. In cases where a processor is included within a clock domain, the processor may have control over the timer included therein and is able to start, stop, and/or reset the timer. The particular number of clock domains shown in FIG. 2 is for purposes of illustration only and is not intended as a limitation.

Subsystem 205 includes a processing device 215 and a timer 225. In one example, processing device 215 is a processor. In another example, processing device 215 is a controller. Processing device 215 and timer 225 are clocked by the clock (not shown) of clock domain 1. Subsystem 205 optionally includes one or more clock control registers shown as CCR 220. When included, CCR 220 stores clock configuration data that can be written by processing device 215 and read by processing device 215. CCR 220 controls, e.g., specifies, the clock frequency of clock domain 2. The clock frequency of clock circuitry (not shown) of clock domain 2 is determined or set by the configuration data stored in CCR 220.

Subsystem 205 and, more particularly, processing device 215, communicates with subsystem 210 via one or more interfaces illustrated as interface (IF) 230. IF 230 is configured for cross-clock domain communication. Subsystem 210 includes a timer 235 and a processing device 240. Processing device 240 can be implemented as a processor or a controller as described. Processing device 240 and timer 235 are clocked by the clock (not shown) of clock domain 2. In one aspect, processing device 240 is configured to receive timer values from processing device 215, read timer values from timer 235, and write timer values, e.g., timer value pairs, from both timers 225 and 235 to a memory such as memory 245. In an alternative example, processing device 240 is incorporated into control circuitry included within, or as part of, timer 235 as may be the case with processing device 215.

While memory 245 is illustrated as being located within subsystem 210, the particular location of memory 245 is not intended as a limitation. In one example, memory 245 is located within subsystem 205. In another example, processing device 240 can write the timer values to a memory located off of IC 200, e.g., to an external memory. In another example, timer values, e.g., timer value pairs, can be sent from processing device 240 to an external memory through subsystem 205. In still another example, trace data, including training data, can be sent from either processing device 215 and/or 240 to a host system communicatively linked with IC 200.

IC 200 is configured to implement a system that is operational and, as such, can be subjected to testing. Accordingly, the digital system implemented within IC 200 including subsystems 205 and 210 can be referred to as a system under test (SUT). During operation, subsystem 205 can record events, e.g., trace data, that occur within a memory such as memory 245, a memory located within processor subsystem 205, or an external memory. Similarly, subsystem 210 records events, e.g., trace data, that occur within memory 245, a memory within processor subsystem 205, or an external memory.

The events can be reviewed for purposes of testing and evaluation. The timestamp of each respective event is set or specified with reference to the particular clock domain in which the event occurred. While events that occur within a same clock domain may be chronologically ordered since the timestamp for each event is determined from a same clock source, events from more than one clock domain may not be chronologically ordered without first synchronizing the different clock domains from which the events originated.

In one aspect, processing device 215 is configured to initiate a training process that allows timer 225 to be synchronized with timer 235, thereby synchronizing clock domain 1 with clock domain 2. In general, processing device 215 sends timer values for timer 225 to processing device 240. Processing device 240, responsive to receiving the timer value(s) for timer 225 from processing device 215, reads a timer value from timer 235. Each received timer value from timer 225 is paired with a timer value read from timer 235 to create a timer value pair. Using multiple timer value pairs, an offset can be determined between timer 225 and timer 235 and, as such, clock domains 1 and 2. In one aspect, the timer value pairs can be used to determine a ratio of the clock frequency of clock domain 1 and the clock frequency of clock domain 2.

In another aspect, processing device 215 is able to read clock configuration data from CCR 220 directly to determine the clock frequency within clock domain 2. As processing device 215 may operate at a known clock frequency within clock domain 1, or, in the alternative, read another CCR indicating the clock frequency of clock domain 1, processing device 215 can be configured to compute the ratio using the frequency values directly rather than deriving the ratio from the timer value pairs. Using the aforementioned data, events occurring in more than one clock domain can be synchronized within a common clock domain for purposes of analysis.

Figure 3:
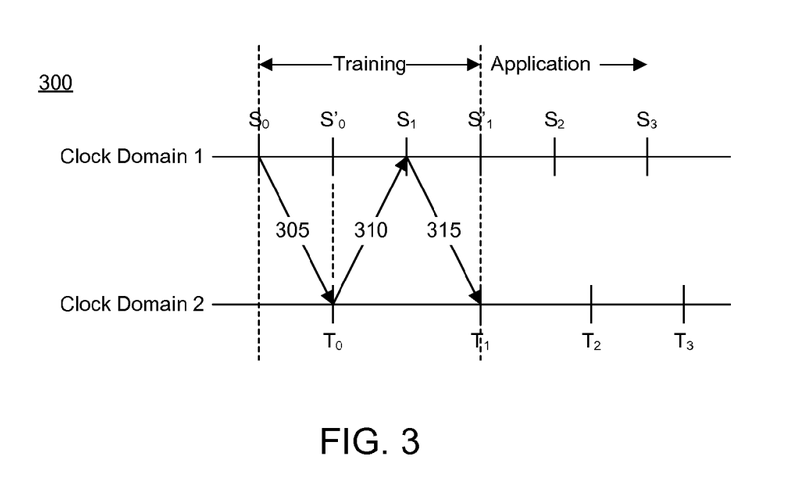
FIG. 3 is a timing diagram illustrating an example of a training process.

FIG. 3 is a timing diagram 300 illustrating an example of a training process. The training process illustrated in FIG. 3 is performed by a digital system, e.g., an IC, including two or more different clock domains. In one aspect, the training process illustrated in FIG. 3 can be performed by an IC having an architecture described with reference to FIGS. 1 and/or 2.

FIG. 3 illustrates a first timeline corresponding to clock domain 1 and a second time line corresponding to clock domain 2. As discussed, each of clock domain 1 and clock domain 2 may or may not include a processor configured to execute program code. In any case, each timeline illustrates times of chronologically ordered events that occur within the corresponding clock domain. Events illustrated in FIG. 3 can be stored within a memory as described as part of a trace or testing process during operation of the digital system. The time indicators on each timeline are determined from the clock, and thus timer, in the respective clock domain. For example, within clock domain 1, events occurring at times $S_0$, $S_1$, $S_2$, and $S_3$ have been recorded within a memory. Within clock domain 2, events occurring at times $T_0$, $T_1$, $T_2$, and $T_3$ have been recorded within a memory.

For purposes of illustration, reference is made to FIGS. 2 and 3 in combination. The training process begins at time $S_0$ when processing device 215 reads a current timer value, e.g., a first timer value corresponding to $S_0$, from timer 225 and sends the first timer value of timer 225 to processing device 240 as message 305. At time $T_0$, responsive to receiving message 305, processing device 240 reads a timer value, e.g., a first timer value corresponding to time $T_0$, from timer 235. The first timer value of timer 225 and the first timer value of timer 235 are stored as a first timer value pair as $(S_0, T_0)$. Responsive to receipt of message 305, processing device 240 also can send message 310 to processing device 215.

Responsive receiving message 310 at time $S_1$, processing device 215 reads a current timer value, e.g., a second timer value corresponding to time $S_1$, from timer 225 and sends the second timer value from timer 225 to processing device 240 as message 315. At time $T_1$, responsive to receiving message 315, processing device 240 reads a current timer value, e.g., a second timer value corresponding to time $T_1$, from timer 235 and stores the second timer value from timer 225 and the second timer value from timer 235 as a second timer value pair within memory 245 as $(S_1, T_1)$.

Each timer value pair can be interpreted as, or represent, an (x, y) coordinate pair and be used to generate an expression that can transform the times of events in one clock domain to corresponding times in the other clock domain. For example, the first timer value of timer 225 can be used as $x_1$, the second timer value of timer 225 can be used as $x_2$, the first timer value of timer 235 can be used as and the second timer value of timer 235 can be used as $y_2$. As such, two coordinates can be formed as: $(x_1, y_1)$ and $(x_2, y_2)$ in which $x_1=S_0$; $y_1=T_0$; $x_2=S_1$; and $y_2=T_1$. Having two coordinates, a value for a slope (m) can be determined using the expression $$\frac{y_1 - y_2}{x_1 - x_2}.$$

A value for a y-intercept (b) can be calculated, in general, to the expression $(S_1+S_0)/2$. Using the linear expression "y=mx+b," a time within one time domain can be converted to a corresponding time in the other clock domain, thereby allowing the events of both time domains to be viewed or evaluated in a common clock domain or in absolute time.

It should be appreciated that while having two coordinates allows computation for a value of m, in architectures in which the clock frequencies are known or can be determined from reading clock configuration registers as described, a value of m can be determined as a ratio of the determined clock frequencies for each respective clock domain. For example, processing device 215 is aware of the clock frequency of clock domain 1 and can determine the clock frequency of clock domain 2 from the clock configuration register. In that example, a value for m can be directly determined as the ratio without relying upon timer value pairs. Using known clock frequencies as described to calculate slope provides for increased accuracy over the technique in which two coordinates are used in the expression $$\frac{y_1 - y_2}{x_1 - x_2}.$$

The training process can be performed one or more times during operation of a digital system. Training can be performed, for example, from time-to-time, periodically, or responsive to selected timer synchronization events. Examples of timer synchronization events can include, starting a timer, stopping a timer, resetting a timer, changing the clock frequency of a clock domain (e.g., writing clock configuration data to a CCR), or the like. As discussed, the timer in a processor clock domain can be started, stopped, or reset, thereby necessitating synchronization. The clock frequency in one portion of the digital system can be changed during operation, e.g., in the field by writing to CCRs as described, thereby necessitating synchronization. In any case, it should be appreciated that each time the training process is executed, the necessary data for translating times in one clock domain to another, e.g., either the timer value pairs or the values for m and b, can be stored.

For example, first training data can be stored followed by first trace data. Referring to FIG. 3, the first training data includes the time value pairs formed of $S_0$, $S_1$, $T_0$, and $T_1$ shown in the training region. The first training data is used to adjust the event times of the first trace data from times within clock domain 2 to times corresponding to the clock domain 1. The first trace data, for example, includes times $S_2$, $S_3$, $T_2$, and $T_3$ in the application region. The first trace data can be followed by second training data and then second trace data, etc. The second training data can be used to adjust the event times in the second trace data from times corresponding to clock domain 2 to times corresponding to clock domain 1, or vice versa.

It should be appreciated that the timelines pictured in FIG. 3 are show as being time aligned for purposes of illustration. Because each timeline is in a different clock domain and the timer within clock domain 1 can be started, stopped, and reset (e.g., being software controlled), the raw trace data is not chronologically ordered when looking at events from both clock domains without first performing synchronization as described herein. For example, $T_0$ is known to occur after $S_0$ only after performing synchronization which further indicates the amount of time (with reference to either clock domain 1 or clock domain 2 depending upon the conversion) by which $T_0$ comes after $S_0$.

The time $S'_0$ illustrates an estimate of the time $T_0$ in the timeline corresponding to clock domain 1. In one example, $S'_0$ is calculated as $(S_1+S_0)/2$, corresponding to the y-intercept b. This presumes an equal trip time for a message to travel from processing device 215 to processing device 240 and to travel from processing device 240 to processing device 215. $S'_0$ also can be estimated a different way. For example, $S'_0$, or b, can be calculated using the expression of $(S_1+S_0)/2$ and applying a scaling factor to account for known travel time for sending messages between the two clock domains, e.g., a system delay where sending a message in one direction takes longer than sending a message in the other direction. Depending upon the implementation of the digital system and the known time to send messages, the offset determined as described within this specification can be scaled or adjusted for system delay.

Figure 4:
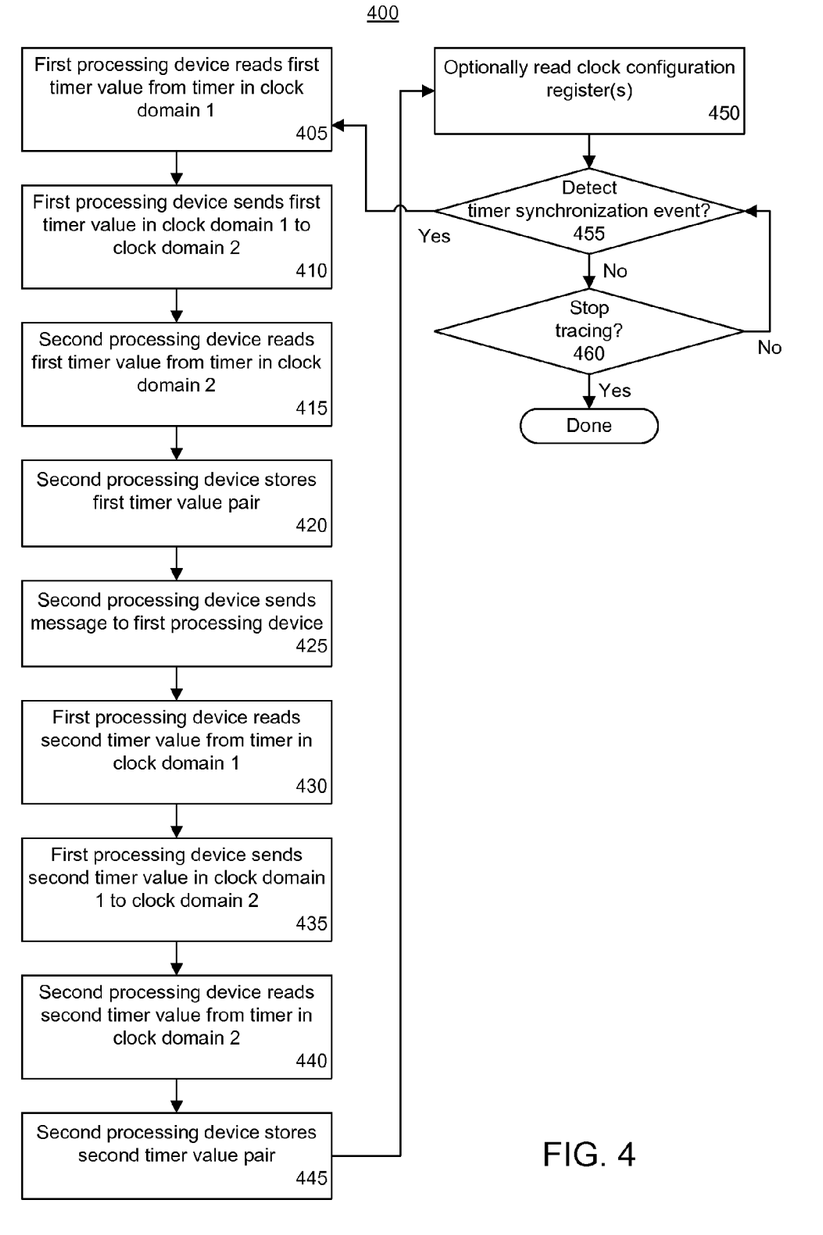
FIG. 4 is a flow chart illustrating an exemplary method of testing a digital system.

FIG. 4 is a flow chart illustrating an exemplary method 400 of testing a digital system. Method 400 can be performed by a digital system as described with reference to FIGS. 1-3 of this specification. In one aspect, program code and/or hardware description language (HDL) that collectively configures an IC to implement the digital system (e.g., the SUT), can be instrumented. The instrumentation of the program code executed by the processor and/or the HDL specifying the circuitry implemented within the electronic circuitry portion of the digital system is instrumented to include the necessary functionality and/or circuit structures to implement the functions described.

Accordingly, method 400 can begin in a state where the SUT, including the necessary testing structures that may be required, is operating. In block 405, a first processing device (e.g., a processor or a controller as the case may be) within clock domain 1 reads a first timer value from a timer also in clock domain 1. In block 410, the first processing device sends the first timer value for the timer in clock domain 1 to clock domain 2. For example, the first processing device sends the first timer value to a second processing device within clock domain 2. In block 415, the second processing device reads a first timer value from the timer in clock domain 2. In block 420, the second processing device stores or writes the first timer value from clock domain 1 and the first timer value from clock domain 2 as a first timer value pair.

In block 425, the second processing device sends a message to the first processing device. In one example, the second processing device sends the message responsive to receiving the message including the first timer value from the first processing device. In another example, the second processing device sends the message to the first processing device responsive to completing a storage operation of the first timer value pair to memory. In block 430, responsive to receiving the message from the second processing device, the first processing device reads a second timer value from the timer in clock domain 1. In block 435, the first processing device sends the second timer value to clock domain 2 and, more particularly to the second processing device.

In block 440, the second processing device, responsive to receiving the second timer value from the first processing device, reads a second timer value from the timer in clock domain 2. In block 445, the second processing device stores or writes a second timer value pair to memory. The second timer value pair includes the second timer value from the timer in clock domain 1 and the second timer value from the timer in clock domain 2.

In block 450, the first processing device (or the second processing device as the case may be) optionally reads clock configuration registers that dictate the clock frequency in use in clock domain 1 and/or clock domain 2. The clock configuration data can be stored. In one aspect, the clock configuration data can be sent from one processing device to the other for storage and/or processing.

In block 455, a determination can be made as to whether a timer synchronization event has been detected. Time synchronization events can be detected by either one or both of the first processing device or the second processing device. If so, method 400 can loop back to block 405 to perform the training process again. If not, method 400 can proceed to block 460 to determine whether tracing is to be stopped. If so, method 400 can end. If not, method 400 can loop back to block 455 to continue processing.

Figure 5:
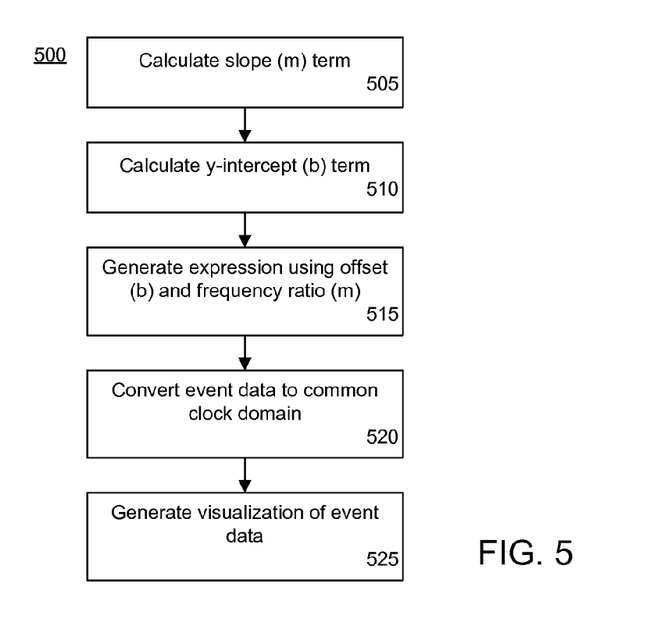
FIG. 5 is a flow chart illustrating an exemplary method of processing event data from multiple clock domains.

FIG. 5 is a flow chart illustrating an exemplary method 500 of processing event data from multiple clock domains. In general, method 500 can be performed by a processing device. In one example, method 500 can be performed by a data processing system, e.g., a computer, having a processing device such as a central processing unit. For example, trace data that is collected by the SUT as described in addition to any training data that is generated can be offloaded or stored within a computer for analysis. In another aspect, one or more of the blocks pictured in FIG. 5 can be performed by a processing device within the SUT itself, whether a controller or a central processing unit, while one or more other blocks still may be performed by a computer or other host system.

In block 505, a slope or "m" term can be calculated for the expression "y=mx+b." The slope represents a ratio of the first clock frequency for the first clock domain with the second clock frequency for the second clock domain. As described, the slope can be calculated using the expression $$\frac{y_1 - y_2}{x_1 - x_2},$$

in which the values for $x_1$, $x_2$, $y_1$, and $y_2$ correspond to timer values (e.g., timer value pairs). In another example, when clock configuration data is available or has been stored that indicates the particular clock frequency for clock region 1 and clock region 2, a direct ratio can be determined without using timer value pairs.

In block 510, the value of the y-intercept term can be calculated by solving for the value of b using the expression $(S_1+S_0)/2$, where $S_1$ and $S_0$ correspond to times within clock domain 1 as previously described. The value of b represents an offset between the first timer in the first clock domain and the second timer in the second clock domain. As noted, the value of b optionally can be adjusted as described to account for system delay. In block 515, having a value for both m and b, the expression y=mx+b can be generated and/or stored. Appreciably, the actual expression need not be explicitly stored as the expression is fully defined with the values m and b calculated as described, which can be stored.

In one example, blocks 505, 510, and 515 can be performed by a processing device within the SUT, e.g., by either the processor or the controller. Such computations can be performed, for example, in real time or in substantially real time. As used herein, the phrase "real time" means a level of processing responsiveness that a user or system senses as sufficiently immediate for a particular process or determination to be made, or that enables the processor to keep up with some external process. In another example, however, blocks 505, 510, and/or 515 can be performed by a data processing system that is separate and distinct from the SUT. For example, blocks 505, 510, and/or 515 can be performed as part of a data analysis process after trace data has been collected from the SUT or while trace data is being collected from the SUT.

In block 520, the processing device can convert the event data to a common clock domain. Using the linear expression that was determined, the time of one or more or each event from one clock domain can be converted into a corresponding time in the other clock domain. After the conversion, the events are both specified using a time corresponding to a same (e.g., one or a common), clock domain. In block 525, the processing device optionally generates a visualization of the event data using the common clock domain.

As discussed, one or more of the blocks described with reference to FIG. 5 can be performed by a computer or host system. For example, blocks 520 and 525, in general, will be performed by processing device included within such a computer system. In that case, trace data, including training data, is transferred to the computer system for analysis after the tracing is complete or while the tracing is performed within the IC communicatively linked to the IC that implements the SUT.

Figure 6:
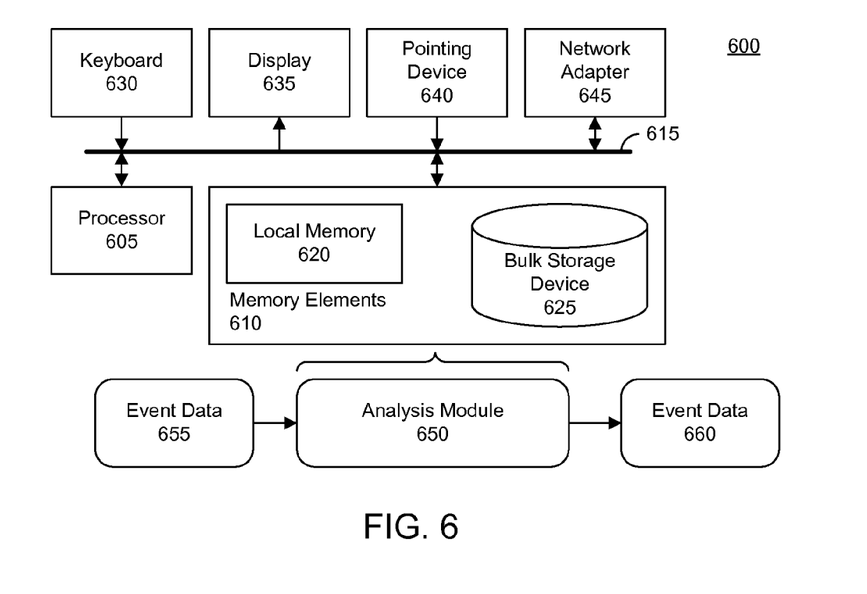
FIG. 6 is an exemplary data processing system.

FIG. 6 is an exemplary data processing system (system) 600. System 600 includes at least one processing device illustrated as processor 605, e.g., a central processing unit, coupled to memory elements 610 through a system bus 615, or other suitable circuitry. As such, system 600 stores program code within memory elements 610. Processor 605 executes the program code accessed from memory elements 610 via system bus 615. In one aspect, for example, system 600 can be implemented as a computer or other programmable data processing apparatus that is suitable for storing and/or executing program code. It should be appreciated, however, that system 600 can be implemented in the form of any system including a processor and memory that is capable of performing the functions described within this specification.

Memory elements 610 can include one or more physical memory devices such as, for example, local memory 620 and one or more bulk storage devices 625. Local memory 620 refers to random access memory or other non-persistent memory device(s) generally used during actual execution of the program code. Bulk storage device(s) 625 can be implemented as a hard drive or other persistent data storage device. System 600 also can include one or more cache memories (not shown) that provide temporary storage of at least some program code in order to reduce the number of times program code must be retrieved from bulk storage device 625 during execution.

Input/output (I/O) devices such as a keyboard 630, a display 635, and a pointing device 640 optionally can be coupled to system 600. The I/O devices can be coupled to system 600 either directly or through intervening I/O controllers. A network adapter 645 can be coupled to system 600 to enable system 600 to become coupled to other systems, computer systems, remote printers, and/or remote storage devices through intervening private or public networks. Modems, cable modems, and Ethernet cards are examples of different types of network adapter 645 that can be used with system 600.

As pictured in FIG. 6, memory elements 610 can store an analysis module 650. Analysis module 650, being implemented in the form of executable program code, is executed by system 600 and, as such, can be considered an integrated part of system 600. System 600 can perform one or more or all of the various blocks described with reference to FIG. 5. For example, system 600 can determine the m and b terms and process event data 655, which includes events from two or more different clock domains, and generate event data 660 in which the times of events are modified and in a common clock domain.

It should be appreciated that the techniques described within this specification can be used to synchronize more than two clock domains. In that case, one clock domain can be selected as the "common clock domain." Accordingly, terms for m and b can be determined between the selected (common) clock domain and each other clock domain to be synchronized using the techniques described herein. Using the m and b terms (y=mx+b expression) determined for each clock domain pair, the time of events within each different clock domain of interest within the trace data can be adjusted to correspond to times of the common clock domain.

Figure 7:
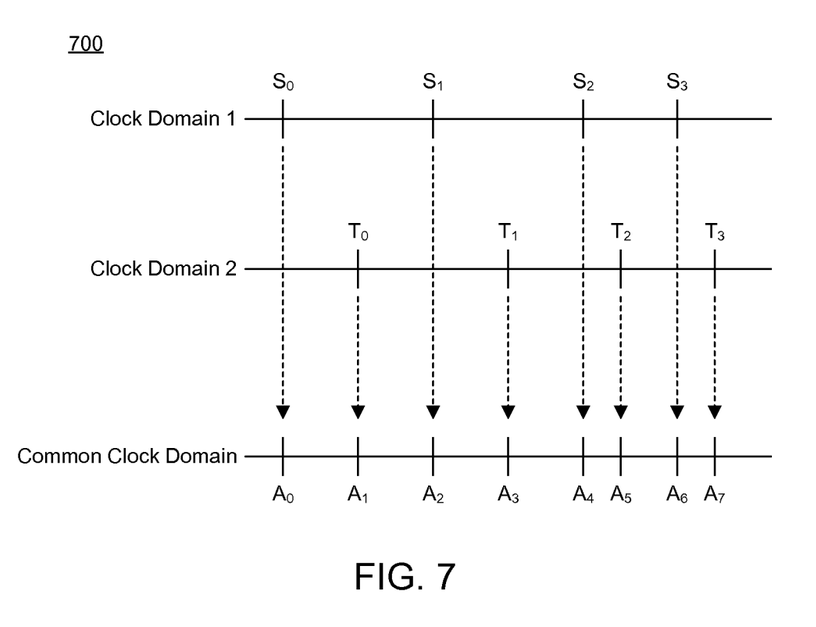
FIG. 7 is a timing diagram illustrating an example of events from different clock domains synchronized within a common clock domain.

FIG. 7 is a timing diagram 700 illustrating an example of events from different clock domains synchronized within a common clock domain. More particularly, FIG. 7 illustrates the events stored as part of trace data from clock domain 1 and clock domain 2 of FIG. 3 after conversion or adjustment of one set of events, e.g., from either the timeline for clock domain 1 or the timeline for clock domain 2, to the other clock domain as the common clock domain using the y=mx+b expression. The times represented on the timeline for the common clock domain represent, in effect, absolute times, and illustrate the actual difference in time between the various events occurring in both clock domain 1 and clock domain 2. Accordingly, times $S_0$, $S_1$, $S_2$, $S_3$, $T_0$, $T_1$, $T_2$, and $T_3$ are chronologically ordered on the common clock domain as $S_0$, $T_2$, $S_1$, $T_1$, $S_2$, $T_2$, $S_3$, and $T_3$ and represented as times $A_0$, $A_1$, $A_2$, $A_3$, $A_4$, $A_5$, $A_6$, and $A_7$, respectively.

For purposes of explanation, specific nomenclature is set forth to provide a thorough understanding of the various inventive concepts disclosed herein. The terminology used herein, however, is for the purpose of describing particular embodiments only and is not intended to be limiting. For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more features can be realized in hardware or a combination of hardware and software. One or more features can be realized in a centralized fashion in one system or in a distributed fashion where different elements are spread across several interconnected systems. Any kind of data processing system or other apparatus adapted for carrying out at least a portion of the methods described herein is suited.

One or more features further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various embodiments of the one or more embodiments disclosed herein. In this regard, one or more blocks in the flowcharts or block diagrams may represent a module, segment, or portion of code, which includes one or more executable instructions for implementing the specified logical function(s).

It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

The various features disclosed within this specification can be embodied in other forms without departing from the spirit or essential attributes thereof. Accordingly, reference should be made to the following claims, rather than to the foregoing specification, as indicating the scope of the features described.

What is claimed is:

1. A method of testing a digital system, comprising:
calculating a first ratio of a first clock frequency for a first clock domain and a second clock frequency for a second clock domain different from the first clock domain using a processing device;
calculating a first offset between a first timer in the first clock domain and a second timer in the second clock domain using the processing device; and
using an expression dependent upon the first offset and the first ratio, converting event data from at least one of the first clock domain or the second clock domain to a common clock domain;
wherein calculating the ratio comprises:
responsive to receiving a first timer value from the first timer within the second clock domain, determining a first timer value from the second timer in the second clock domain:
responsive to receiving a second timer value from the first timer within the second clock domain, determining a second timer value from the second timer in the second clock domain; and
the second timer value from the first timer is sent responsive to a message sent from the second clock domain to the first clock domain responsive to the first timer value from the first timer.

2. The method of claim 1, wherein the expression is specified as a linear equation in which the first offset is a y-intercept of the linear equation and the first ratio is a slope of the linear equation.

3. The method of claim 1, wherein calculating the ratio comprises:
determining at least one of the first clock frequency or the second clock frequency from a clock configuration register.

4. The method of claim 1, wherein calculating the ratio comprises:
storing the first timer value for the first timer and the first timer value for the second timer as a first timer value pair within a memory; and
storing the second timer value for the first timer and the second timer value for the second timer as a second timer value pair within the memory.

5. The method of claim 1, wherein calculating the first offset comprises:
determining an average of the first and second timer values from the first timer.

6. The method of claim 1, further comprising:
adjusting the first offset according to system delay.

7. The method of claim 1, further comprising:
responsive to detecting a timer synchronization event, calculating a second offset between the first timer in the first clock domain and the second timer in the second clock domain.

8. The method of claim 1, further comprising:
responsive to detecting a timer synchronization event, calculating a second ratio of clock frequencies for the first and second clock domains.

9. A method of testing a digital system, comprising:
within a first clock domain of the digital system comprising a first timer, sending a first timer value and a second timer value from the first timer to a second clock domain of the digital system;
determining a first timer value from a second timer in the second clock domain responsive to receiving the first timer value from the first timer;
determining a second timer value from the second timer responsive to receiving the second timer value from the first timer;
wherein the second timer value from the first timer is sent responsive to a message sent from the second clock domain to the first clock domain responsive to the first timer value from the first timer;
storing a first timer value pair comprising the first timer value from the first timer and the first timer value from the second timer within a memory using a processing device; and
storing a second timer value pair comprising the second timer value from the first timer and the second timer value from the second timer within the memory.

10. The method of claim 9, further comprising:
generating a linear expression comprising a slope representing a ratio of a clock frequency of the first clock domain and a clock frequency of the second clock domain and a y-intercept representing an offset between the first timer and the second timer.

11. The method of claim 10, further comprising:
calculating the slope of the linear expression using the first and second timer value pairs as coordinate pairs.

12. The method of claim 10, wherein at least one clock frequency is determined by reading a clock configuration register.

13. The method of claim 10, further comprising:
determining an average of the first and second timer values from the first timer as the y-intercept.

14. The method of claim 10, further comprising:
using the linear expression, adjusting a time of at least one event from the first clock domain to a time corresponding to the second clock domain; or
using the linear expression, adjusting a time of at least one event from the second clock domain to a time corresponding to the first clock domain.

15. The method of claim 10, further comprising:
responsive to detecting a timer synchronization event:
sending a third timer value and a fourth timer value from the first timer to the second clock domain;
determining a third timer value from the second timer responsive to receiving the third timer value from the first timer;
determining a fourth timer value from the second timer responsive to receiving the fourth timer value from the first timer;
storing a third timer value pair comprising the third timer value from the first timer and the third timer value from the second timer; and
storing a fourth timer value pair comprising the fourth timer value from the first timer and the fourth timer value from the second timer.

16. An integrated circuit, comprising:
a first portion of a digital system comprising a first processing device and a first timer configured to operate in a first clock domain;
wherein the first processing device is configured to read timer values from the first timer and send the timer values;
a second portion of the digital system comprising a second processing device and a second timer configured to operate in a second clock domain that is different from the first clock domain;
wherein the second processing device is configured to:
determine a first timer value from the second timer responsive to receiving a first timer value from the first timer;
determine a second timer value from the second timer responsive to receiving a second timer value from the first timer;
store a first timer value pair comprising the first timer value from the first timer and the first timer value from the second timer; and
store a second timer value pair comprising the second timer value from the first timer and the second timer value from the second timer
wherein the second timer value from the first timer is sent responsive to a message sent from the second clock domain to the first clock domain responsive to the first timer value from the first timer.

17. The integrated circuit of claim 16, wherein the first processing device is configured to calculate a slope of a linear expression representing a ratio of a first clock frequency for the first clock domain and a second clock frequency of the second clock domain.

18. The integrated circuit of claim 16, wherein the second processing device is configured to calculate a slope of a linear expression representing a ratio of a first clock frequency for the first clock domain and a second clock frequency of the second clock domain.

19. The integrated circuit of claim 16, wherein the first processing device is configured to calculate a y-intercept of a linear expression representing an offset between the first timer and the second timer as an average of the first and second timer values from the first timer.

20. The integrated circuit of claim 16, wherein the second processing device is configured to calculate a y-intercept of a linear expression representing an offset between the first timer and the second timer from the first and second timer values from the first timer.

\* \* \* \* \*